(12) United States Patent
Shimoda et al.

(10) Patent No.: US 6,655,540 B2
(45) Date of Patent: Dec. 2, 2003

(54) STRAP ATTACHING STRUCTURE AND ELECTRONIC APPARATUS

(75) Inventors: Yuji Shimoda, Inagi (JP); Hideki Watanabe, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 29 days.

(21) Appl. No.: 09/874,284

(22) Filed: Jun. 6, 2001

(65) Prior Publication Data

US 2002/0044406 A1 Apr. 18, 2002

Related U.S. Application Data

(63) Continuation of application No. PCT/JP99/03326, filed on Jun. 22, 1999.

(30) Foreign Application Priority Data

Dec. 16, 1998 (JP) ............................................. 10-357690

(51) Int. Cl.[7] .................................................. H05K 5/02
(52) U.S. Cl. ........................ 220/4.02; 16/428; 220/4.21; 220/754; 455/575.1; 455/575.6
(58) Field of Search .............................. 220/4.02, 4.21, 220/754, 759; 16/428; 379/433.1, 433.01, 433.11, 433.13; 455/90, 575, 575.8, 575.1, 575.6; 224/929, 930

(56) References Cited

FOREIGN PATENT DOCUMENTS

| JP | 58-159777 | | 10/1983 |
|---|---|---|---|
| JP | 4-10372 | | 1/1992 |
| JP | 5-191057 | * | 7/1993 |
| JP | 8-195191 | | 7/1996 |
| JP | 9-55587 | | 2/1997 |
| JP | 9-321847 | | 12/1997 |
| JP | 10-22650 | | 1/1998 |
| JP | 10-322039 | | 12/1998 |

OTHER PUBLICATIONS

Parttial translation of 10–357690 from of the JPO web site. Six pages, two pages abstract and four pages detailed description.*

* cited by examiner

*Primary Examiner*—Lee Young
*Assistant Examiner*—Joseph C. Merek
(74) *Attorney, Agent, or Firm*—Staas & Halsey LLP

(57) ABSTRACT

A strap mounting space is formed around a boss formed on an upper cover and a lower cover which, when assembled together, form a case for an apparatus. One, or each, of the upper cover and the lower cover is/are formed integrally with a respective boss, preferably at each corner, so that the respective bosses at corresponding, common corners of the upper and lower covers, when assembled, are in an aligned and abutting relationship. A slits is formed in one of the corners of the upper and lower covers, extending around the respective boss(es) thereof, making up a strap mounting space. A screw 9 is inserted into a corresponding axial hole extending through each boss, affording a sufficient strength of the abutting bosses for supporting the case, with the apparatus therein, by a strap received through the strap mounting space.

16 Claims, 9 Drawing Sheets

STRAP ATTACHING STRUCTURE AND ELECTRONIC APPARATUS

CROSS-REFERENCE TO RELATED APPLICATIONS

This application is based upon and claims priority from Japanese Patent Application No. 10-357690, filed Dec. 16, 1998, the contents being incorporated herein by reference, and a continuation of PCT/JP99/03326 filed on Jun. 22, 1999.

BACKGROUND OF THE INVENTION

The present invention relates to a carrying strap attaching structure in a portable type electronic apparatus. The present invention also relates to an electronic apparatus to which a strap can be attached.

A case of a portable type electronic apparatus, such as a portable telephone, a portable personal computer, a hand-held terminal (hereinafter referred to as HHT) or a video camera, is generally provided with a strap for securing the case in a closed condition and for protection against dropping. For this purpose, each such portable type electronic apparatus has a structure for mounting a strap.

There are several kinds of straps, such as a neck strap to hang the apparatus from a user's neck or a wrist strap through which a user's wrist is passed and from which the apparatus hangs.

BACKGROUND ART

A conventional method/apparatus, for attaching a strap to a portable type electronic apparatus (hereinafter referred to as a body), is shown in FIGS. 13 and 14, in which a strap fitting metal member is arranged in the housing of the electronic apparatus. In FIGS. 13 and 14, a metal member 20 is fixed to a lower cover 4 by a screw 21. FIG. 14 is a sectional view, taken on line XIV—XIV of FIG. 13, specifically showing a corner portion of the housing.

The upper cover 3 and the lower cover 4 making up the housing are fitted to each other with screws 22. Also, an upper damper 5 and a lower damper 6 are mounted at the corner portion of the upper cover 3 and the lower cover 4, respectively. These dampers 5 and 6 have the function of absorbing shocks applied to the electronic apparatus.

In the example shown in FIGS. 13 and 14, the metal member 20 is formed with a rectangular hole 20' in an L-shaped bottom portion thereof. A strap is attached to the electronic apparatus by inserting a tape portion of the strap into the hole 20'.

The method using the metal member 20 as shown in FIGS. 13 and 14, however, is costly due to the need for the metal member 20. Also, all portable type electronic apparatuses are desirably as small as possible. In the method/apparatus shown in FIGS. 13 and 14, however, a space for mounting the metal member 20 is required, which is a stumbling block to achieving a decreased size of the apparatus, on the one hand, and limits the position for mounting the metal member 20, on the other hand, thereby posing the problem that the strap cannot necessarily be mounted at a convenient position.

In another conventional method/apparatus, as shown in FIG. 15, a screw-receiving metal member 23 is arranged in a housing, of upper and lower cases 3 and 4, respectively, and the tape portion 25 of the strap is mounted to another metal member 24, which is inserted and threaded into the threaded hole of the screw-receiving metal member 23, to thus mount the strap 25 to the housing. Still another conventional method/apparatus is known in which, as shown in FIG. 16, a post 26 for binding the strap is integrally formed with the upper case 3 as disclosed in Japanese Unexamined Patent Publication No. 9-55587.

In the conventional method shown in FIG. 15, threaded members 23 and 24 are required on the housing and the strap 25, respectively, resulting in increased cost and, because the screw-receiving metal member 23 is arranged horizontally in the side of the upper cover 3, a slide mechanism is required in the die for molding the upper cover 3, thereby leading to the disadvantage that the die is complicated.

Also, in the conventional method/apparatus shown in FIG. 16, the circular post 26 extends between the upper and lower walls of the upper cover 3, so a slide mechanism is required in the die for molding the upper cover 3, as in the conventional method/apparatus shown in FIG. 15, thereby similarly leading to the disadvantage that the die is complicated.

As described above, the conventional methods pose the problems that the cost of the portable type electronic apparatus is increased, the strap mounting position is limited and the die is complicated, introducing an increased cost.

SUMMARY OF THE INVENTION

The object of the present invention is to solve the above-mentioned problems and to provide a strap attaching structure for an electronic apparatus intended to reduce the apparatus size without increasing the cost.

According to the present invention, the housing of the electronic equipment is divided into an upper cover and a lower cover, both covers being fixed at a boss formed on at least one of the covers. The upper cover or the lower cover is molded integrally with the boss such that a space for mounting the strap is formed around the boss when the upper cover and the lower cover are assembled together.

With the structure according to the present invention, unlike the conventional methods/apparatuses, the space or the post for mounting the strap is formed with the upper and lower cover assembled. As a result, the die for producing the upper cover or the lower cover is not required to have a slide mechanism and therefore a die for fabricating same is not complicated.

BRIEF DESCRIPTION OF THE DRAWINGS

Embodiments of the present invention will be described in more detail, below, with reference to the accompanying drawings, in which.

DESCRIPTION OF THE PREFERRED EMBODIMENTS

Now, embodiments of the present invention will be explained with reference to the drawings.

Figure 1:
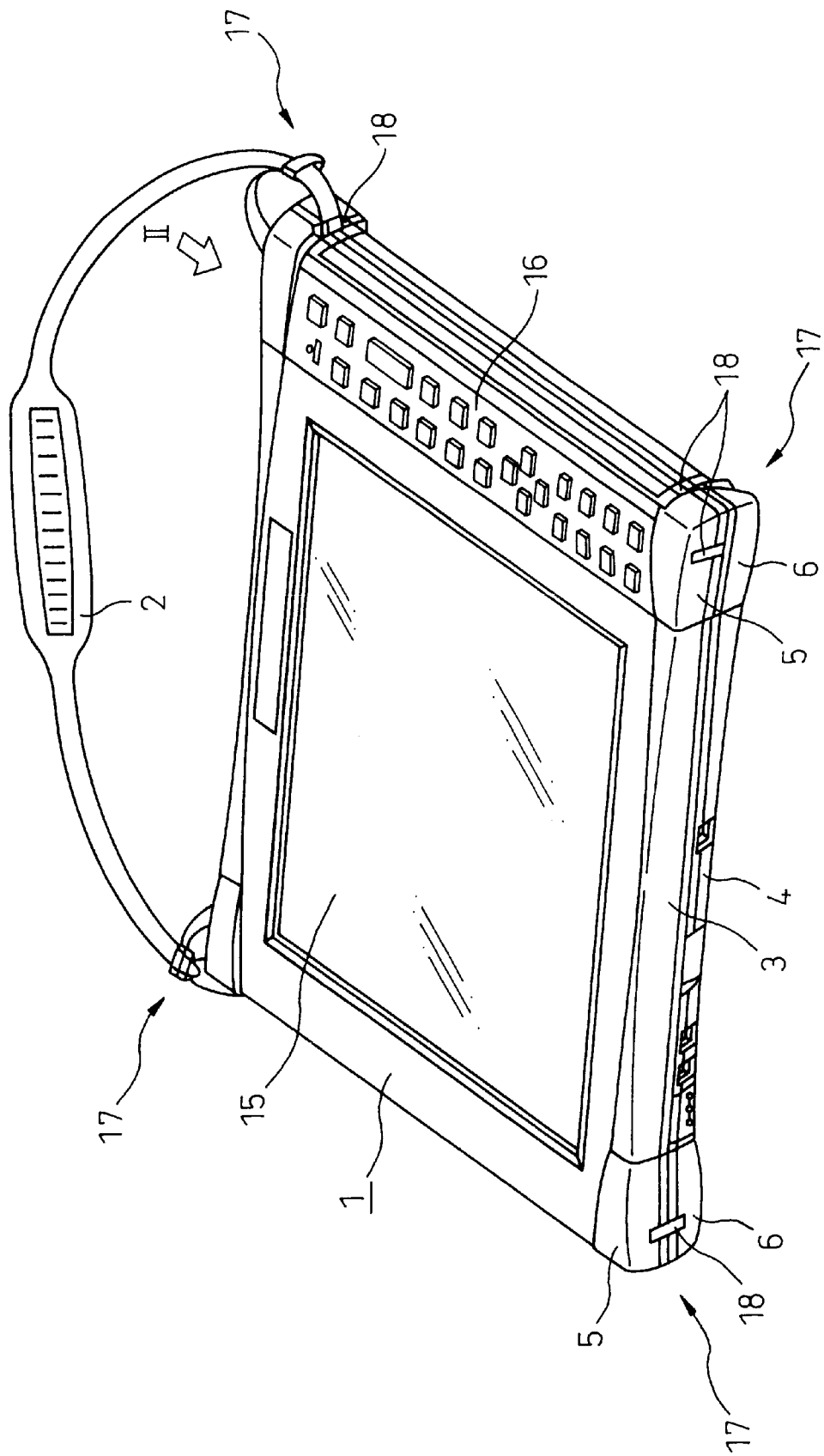
FIG. 1 is a perspective view showing an electronic equipment according to a first embodiment of the present invention.
Figure 2:
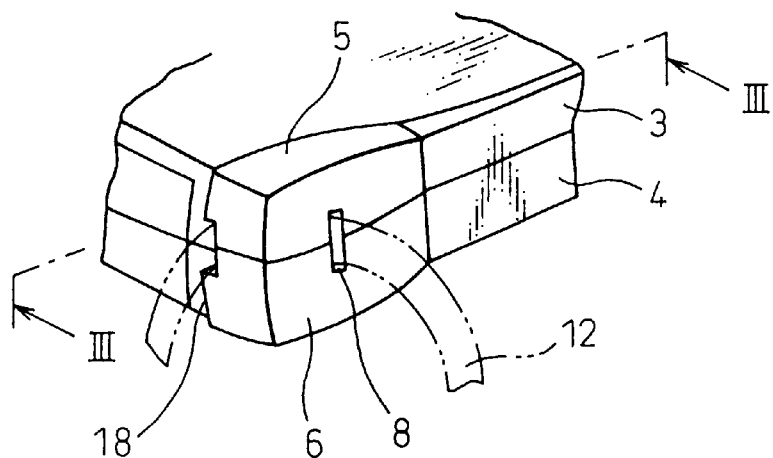
FIG. 2 is a perspective view as taken along arrow II in FIG. 1.
Figure 3:
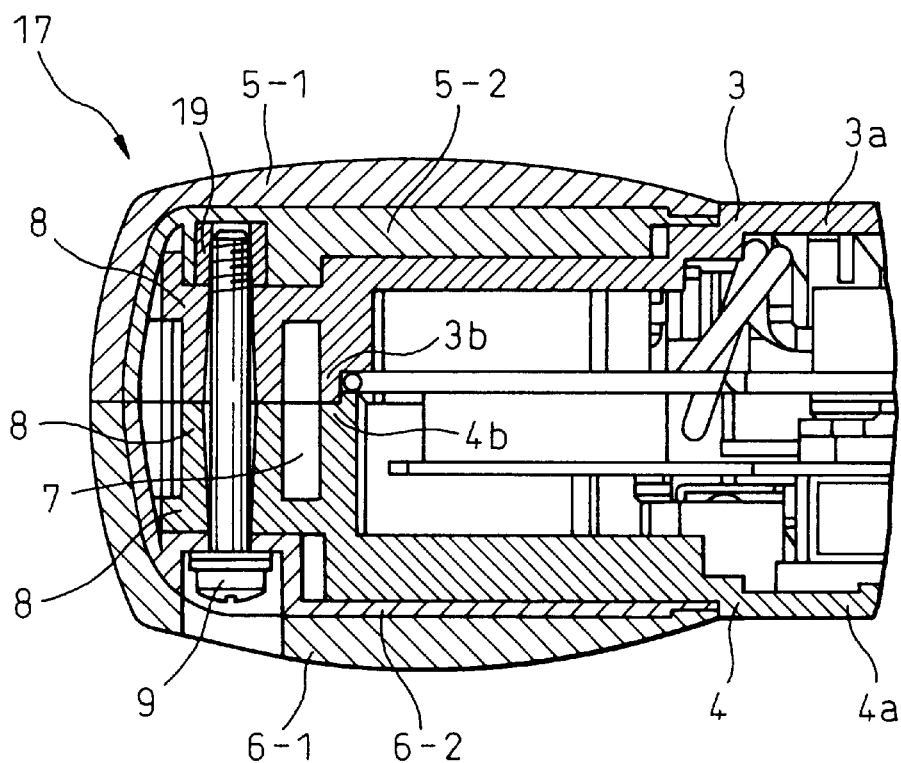
FIG. 3 is a sectional view taken in line III—III in FIG. 2.

FIGS. 1, 2 and 3 are views showing portable electronic equipment according to a first embodiment of the invention, and especially illustrate an apparatus called a hand-held terminal.

FIG. 1 shows an outer appearance of a hand-held terminal 1 (hereinafter referred to as an HHT) to which a neck strap 2 is attached. The HHT 1 shown in FIG. 1 includes a screen 15 formed with a touch panel on the front surface thereof. Also, a keyboard 16, including input keys such as numerical keys and function keys, is arranged on an edge of the screen 15. The HHT 1 is carried by a user to a work-place and used there to input information while holding it in his/her hand. For this purpose, a hand strap or the neck strap 2 can be attached to the HHT 1. The user uses the HHT 1 by hanging the neck strap from his neck, for example, to improve operability and reduce fatigue after a long period of use. Also, the strap can prevent the HHT 1 from dropping.

FIG. 1 shows an example in which respective strap attaching structures 17 are arranged at four corners of the terminal 1 and the neck strap 2 is attached to the respective structures 17 at the upper two corners of the HHT. Arbitrary ones of the four strap attaching mechanisms 17 can be used by the user as desired. For example, the two strap attaching mechanisms 17 located at the diagonal corners can be used.

Also, the HHT 1 according to this embodiment includes damper members 5 and 6 at the four corners for protection against dropping.

In FIGS. 1 to 3, numeral 1 designates a hand-held terminal, numeral 2 a neck strap, numeral 3 an upper cover, numeral 4 a lower cover, numeral 5 an upper damper, numeral 6 a lower damper, and numeral 7 a strap mounting space.

FIG. 2 is a view taken along arrow II in FIG. 1, showing the tape 12 of the strap 2 mounted in a slit 18 formed in the sides of the upper damper 5 and the lower damper 6. Further, a sectional view taken on line III—III of FIG. 2 is shown in FIG. 3.

In FIG. 3, the upper cover 3 and the lower cover 4 are formed of plastic, and bosses 8 are integrally formed with respective covers 3 and 4 so that the covers 3 and 4 can be fixed by a screw 9. The upper cover 3 and the lower cover 4 have outer walls 3a and 4a and inner walls 3b and 4b, respectively. The inner walls 3b and 4b can be joined with each other in opposed relation to each other. As a result, the upper cover 3 and the lower cover 4 make up a case of the HHT 1. A space 7, provided around the boss 8, can be utilized for mounting the strap.

As shown in FIG. 3, the upper cover 3 and the lower cover 4 have bosses 8 formed therewith for fitting the two covers to each other. With the HHT 1 according to this embodiment, a slit-like strap mounting space 7 is formed around the bosses when arranged in abutment against each other.

Figure 4:
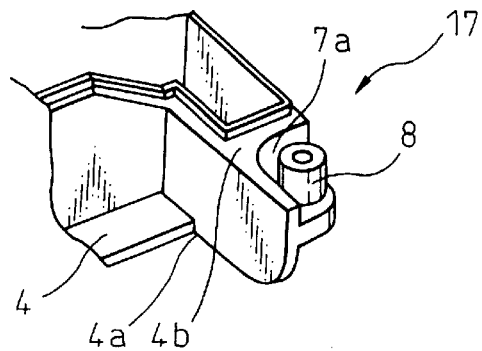
FIG. 4 is a perspective view showing a portion of the lower cover.

FIG. 4 shows a portion of the lower cover 4. The lower cover 4 has the boss 8 and the slit 7a. In similar fashion, the upper cover 3 has a boss 8 and a slit 7a (refer to FIG. 4). In the case where the inner wall 3b of the upper cover 3 and the inner wall 4b of the lower cover 4 are joined with each other, the boss 8 of the upper cover 3 and the boss 8 of the lower cover 4 come into abutment against each other on a straight line. Each boss 8 has a through hole. The slit 7a of the upper cover 3 and the slit 7a of the lower cover 4 form the space 7. Each boss 8 has a free end and each slit 7a is open, so the die can be released easily when the upper cover 3 and the lower cover 4 are molded integrally with the respective bosses 8. Each slit 7a is formed only in a range, corresponding to a quarter of a circle, around the boss 8.

The upper damper 5 and the lower damper 6, which are formed of an elastomer having the properties of both plastic and rubber for protection against dropping, are fixed integrally to the upper cover 3 and the lower cover 4 using the screw 9. The dampers 5 and 6 have some elasticity and can absorb shock which may be exerted on the HHT 1 when dropped. In FIG. 3, each damper is formed of two materials. Specifically, the portions designated by 5-1 and 6-1 are formed of elastomer, while the portions designated by 5-2 and 6-2 are formed of plastic. In the example of FIG. 3, the plastic 5-2 and 6-2 and the elastomer 5-1 and 6-1 are overlaid one on the other in such a manner as to be located inside and outside, respectively. In other words, the plastic 5-2 and 6-2 and the elastomer 5-1 and 6-1 make up the upper damper 5 and the lower damper 6 integrally structured by two-color molding. As described above, these dampers 5 and 6 are mounted at the four corners of the HHT 1.

Figure 5:
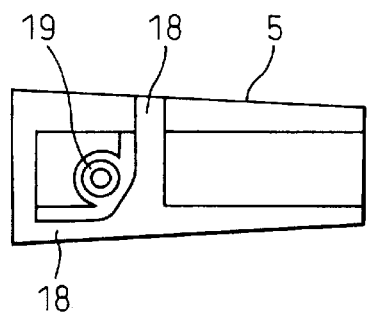
FIG. 5 is a bottom view of the upper damper.

The dampers 5 and 6 are each formed with a slit 18 open to the portion of the upper cover 3 and the lower cover 4 corresponding to the position of the strap mounting space 7 (shown in FIG. 2). By inserting the tape 12 of the strap into the slit 18, it is possible to insert the tape 12 of the strap into the strap mounting space 7. FIG. 5 is a bottom view of the upper damper 5. The upper damper 5 has an insert-molded metal member 19 having a threaded hole. The screw 9 is threaded into the metal member 19 via the through holes of the two bosses 8. Thus, the covers 3 and 4 and the dampers 5 and 6 can be fixed with a common screw 9 thereby to form the space 7 around the bosses 8.

An explanation will be given of the advantage obtained by the use of bosses 8 for mounting the strap, which bosses 8 are arranged for fitting the upper cover 3 and the lower cover 4 to each other. Generally, the upper cover 3 and the lower cover 4 are formed of a comparatively tough resin. In the case where the strap 2 is mounted, however, the portion where the strap 2 is mounted is concentratedly subjected to a load to such an extent that the strap mounting structure 17 is sometimes broken.

According to this embodiment, however, the strap 2 is mounted around the bosses 8. The screw 9 for joining the covers with each other is inserted into the bosses 8. The screw 9 is made of a metal and has a considerably higher strength than resin. As a result, the screw 9 inserted into the bosses 8 performs a function of a reinforcing member for the bosses 8, and the strength required to mount the strap 2 can be secured. Thus, even if the strap 2 is pulled strongly, the strap mounting mechanism (bosses) can be prevented from breaking.

FIGS. 1 to 3 show an example in which the slit 7a constituting the strap mounting space 7 is formed in both the upper cover 3 and the lower cover 4. Nevertheless, the slit 7a can be formed in one of the upper cover 3 and the lower cover 4. In that case, an opening is formed in the portion of the strap mounting space 7 in contact with the other cover to facilitate the sliding of the die at the time of integral molding.

Figure 6:
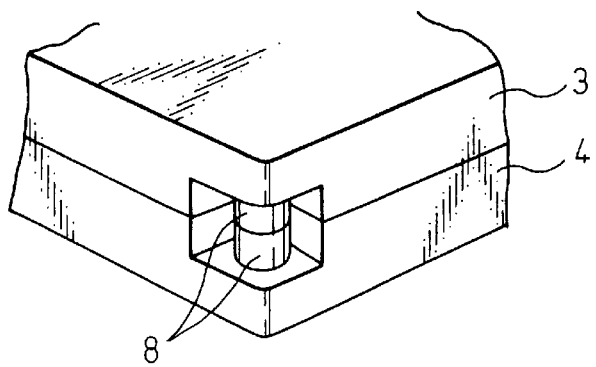
FIG. 6 is a perspective view showing a second embodiment of the present invention.

FIG. 6 is a view showing a second embodiment of the invention and represents a case in which the strap mounting mechanism is configured of the bosses 8 alone. In the example of FIG. 6, a slit 18 is not formed in the upper damper 5 and the lower damper 6, but the upper cover 3 and the lower cover 4 are so configured as to expose the bosses 8 formed on the covers. An effect similar to that of the first embodiment can be achieved by arranging the strap tape around or binding the string at the forward end of the strap to the circular post formed by the bosses 8.

Figure 7:
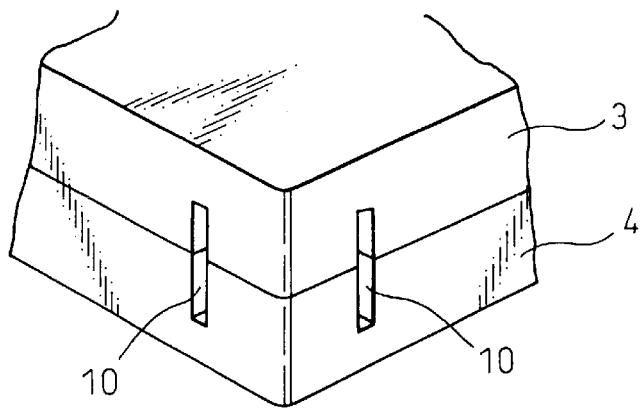
FIG. 7 is a perspective view showing a third embodiment of the present invention.

FIG. 7 is a diagram showing a third embodiment of the invention. This embodiment shows a case in which a slit 10 is formed in the wall surface portion of the upper cover 3 and the lower cover 4, and the strap mounting mechanism is configured of the slit 10. In the example of this embodiment, the strap tape is inserted through the space formed by the slit 10. According to the third embodiment, unlike in the first embodiment, the member equivalent to the upper damper or the lower damper is not mounted at the corners of the HHT.

Figure 8:
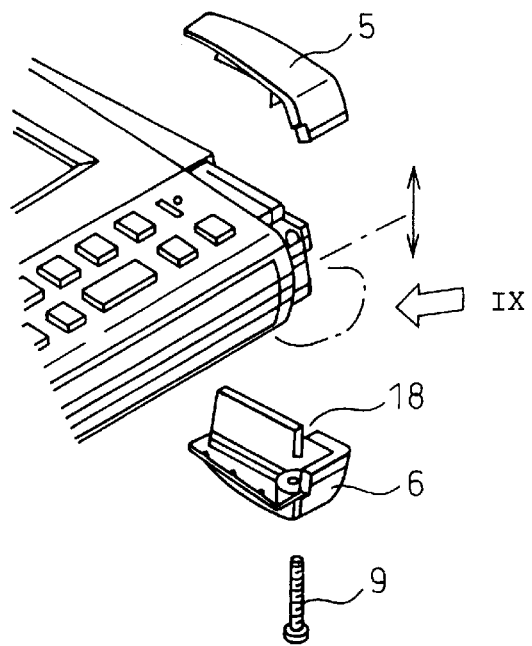
FIG. 8 is an exploded perspective view showing a fourth embodiment of the present invention.
Figure 9:
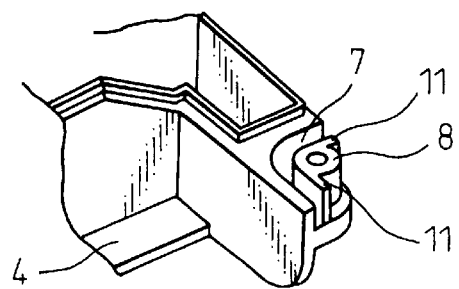
FIG. 9 is a view taken along arrow IX in FIG. 8.

FIGS. 8 and 9 are views showing a fourth embodiment of the invention, in which the forward end of the tape of the strap 2 is prevented from being caught in the gap of the strap mounting space 7 in the first or third embodiment. FIG. 8 is a perspective view and FIG. 9 a view taken along arrow IX of FIG. 8.

In the case of the first embodiment, as shown in FIG. 3, a gap is formed between the bosses 8 and the upper damper 3 or the lower damper 4. For mounting the strap 2 to the HHT 1, the tape portion of the strap is required to be inserted into the strap-mounting slit portion, but in this process, the forward end of the tape portion is liable to be caught or involved in the gap between the bosses 8 and the upper damper 3 or the lower damper 4, with the result that the workability of the strap mounting job is deteriorated to such an extent that the tape portion 12 of the strap fails to be inserted. This is also the case with the third embodiment. In the second embodiment, the bosses 8 are exposed, and therefore the tape portion is not caught. A similar inconvenience occurs, however, in the case where the damper or the like is mounted for shock protection but a gap develops between the bosses and the dampers.

On the other hand, as shown in FIG. 9, according to this embodiment, ribs 11 are formed in the gap between the bosses 8 and the strap mounting space 7. The ribs 11 extend to or near the wall surface of the cover. Therefore, the tape of the strap can be guided by the ribs 11, and is not caught in the internal space. In other words, according to this embodiment, the tape inserted in the strap mounting space is less liable to be caught in the gap between the bosses 8 and the damper or the cover wall surface than in other embodiments. Consequently, the workability of the strap mounting job can be improved.

Figure 10:
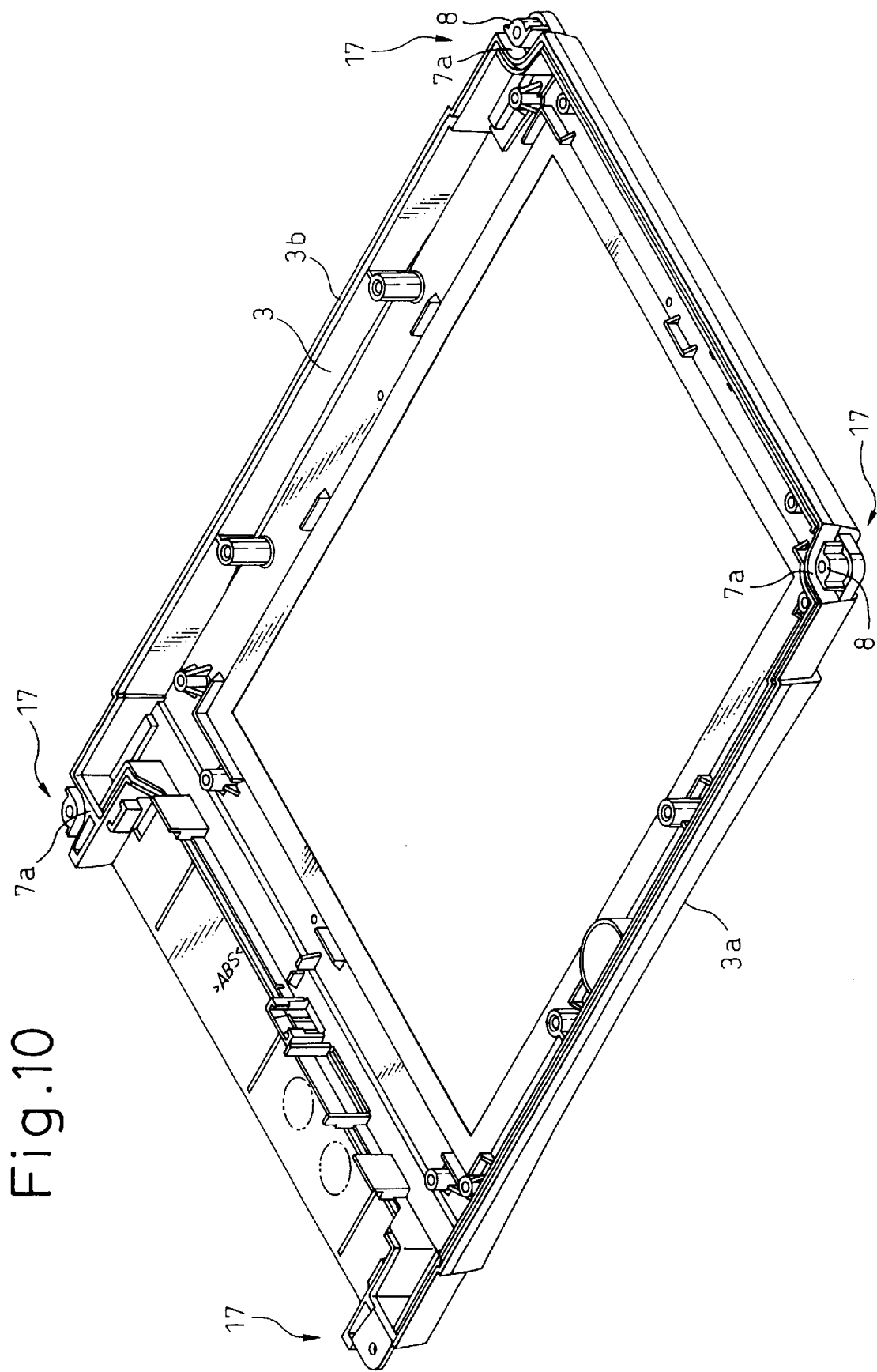
FIG. 10 is a perspective view showing an example of the upper cover.
Figure 11:
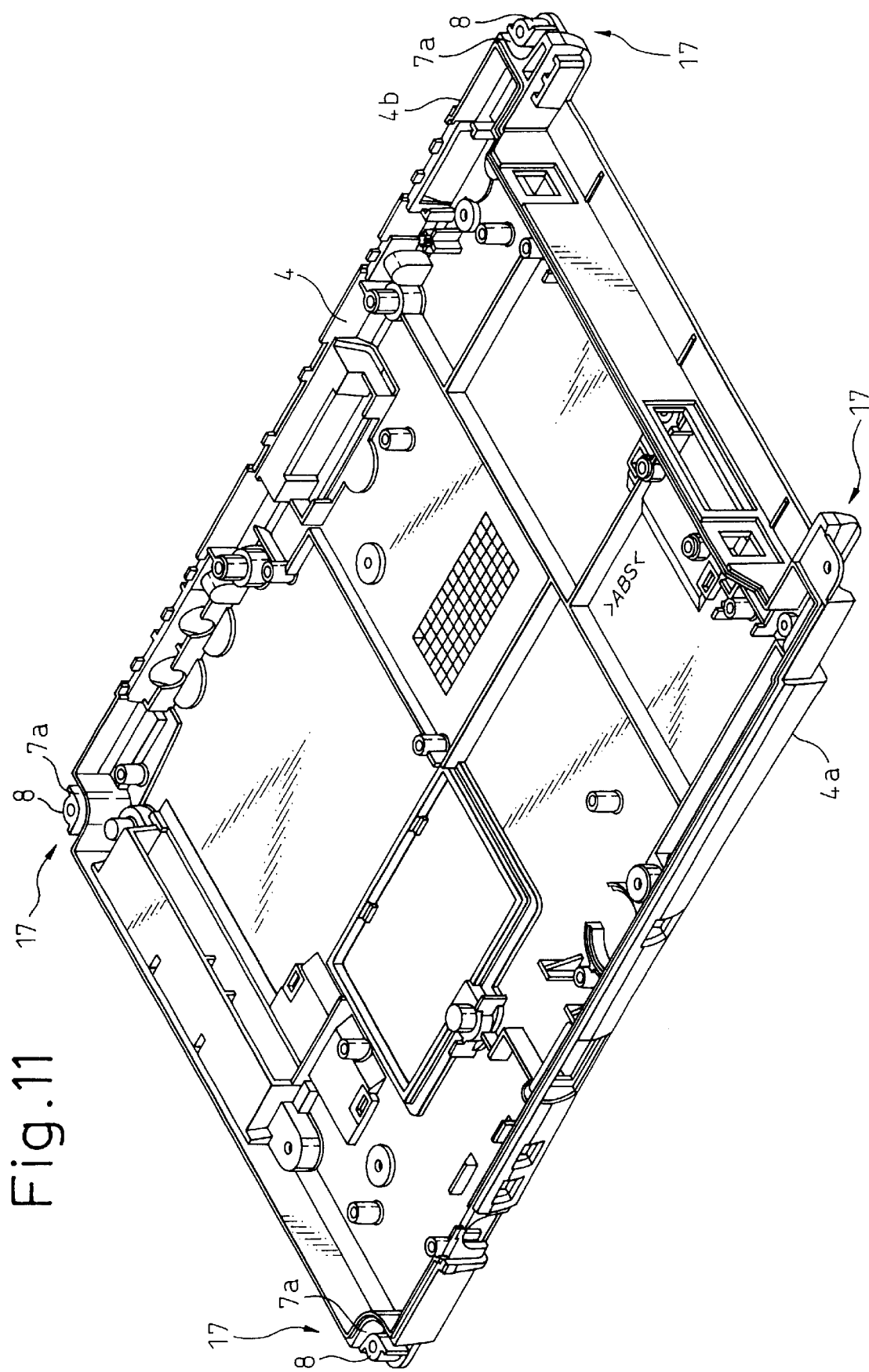
FIG. 11 is a perspective view showing an example of the lower cover.

FIGS. 10 and 11 are views showing an example of the upper cover 3 and the lower cover 4, respectively.

Figure 12:
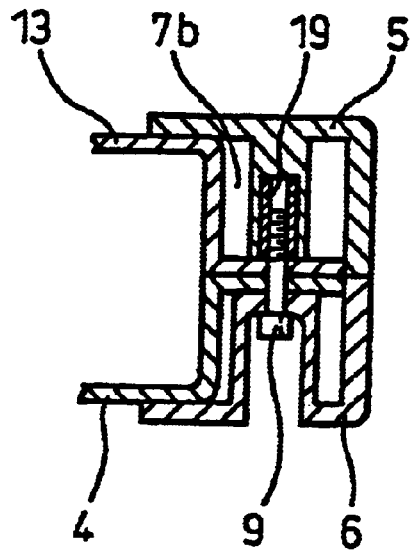
FIG. 12 is a partial view showing the upper cover of FIG. 10 and the lower cover of FIG. 11 assembled to each other.
Figure 13:
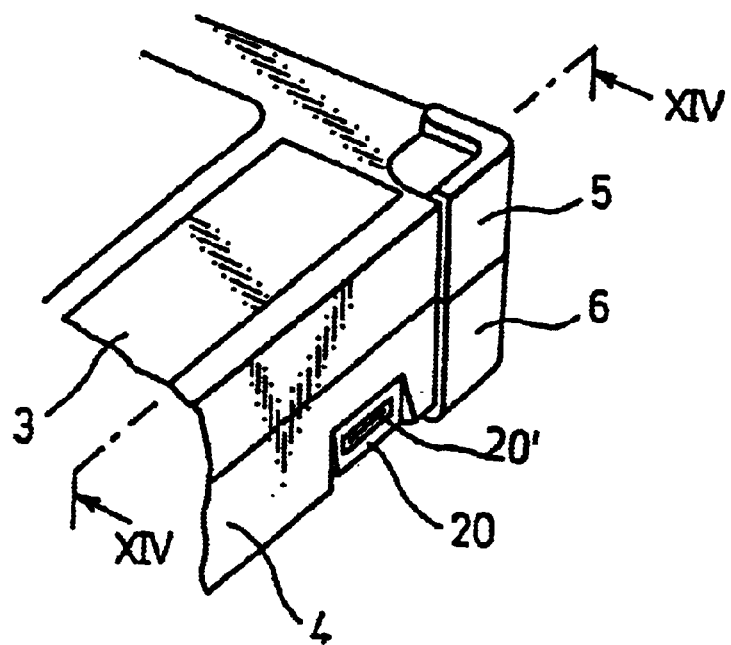
FIG. 13 is a view for explaining a first conventional structure.
Figure 14:
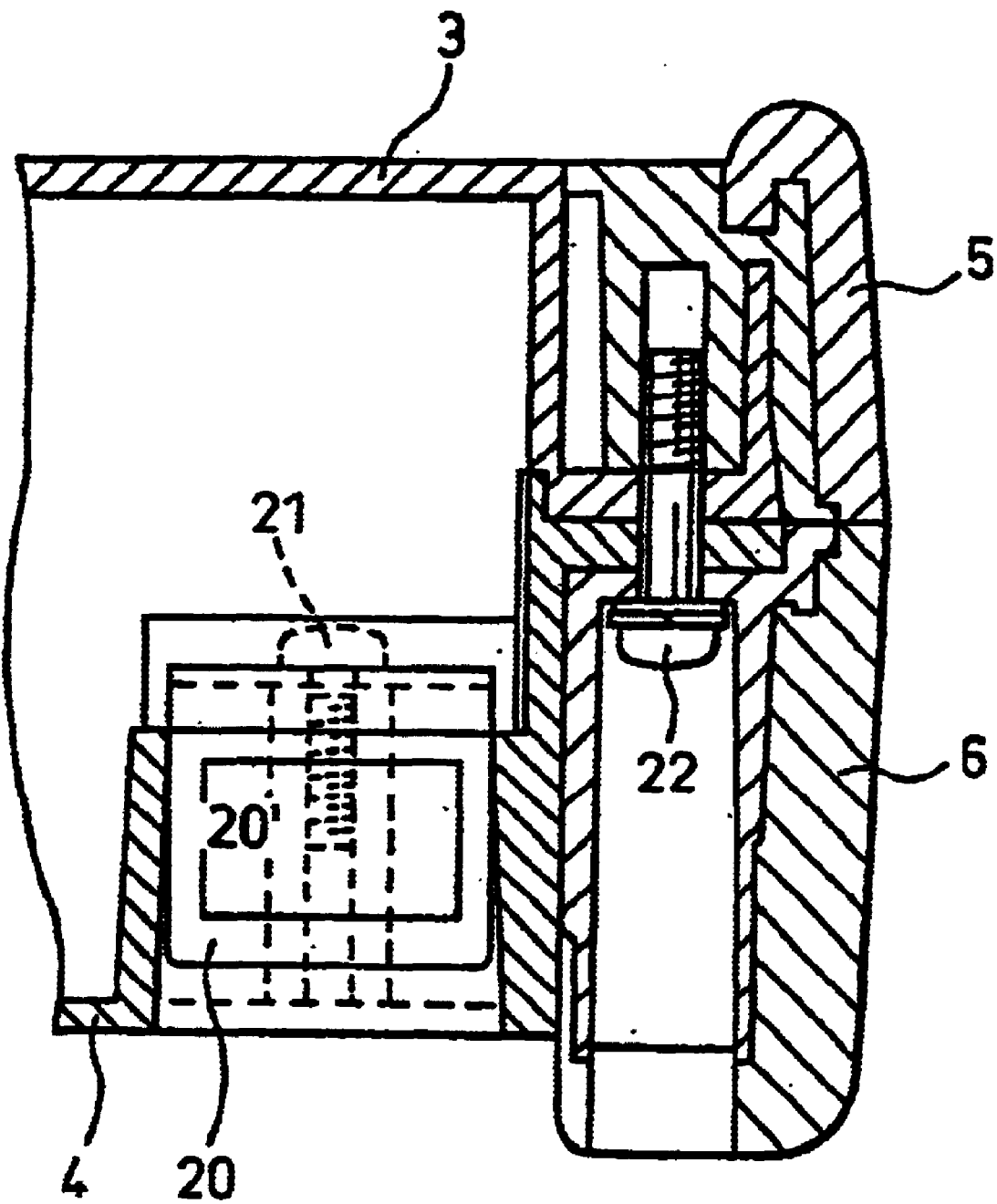
FIG. 14 is a sectional view taken in line XIV—XIV in FIG. 13.
Figure 15:
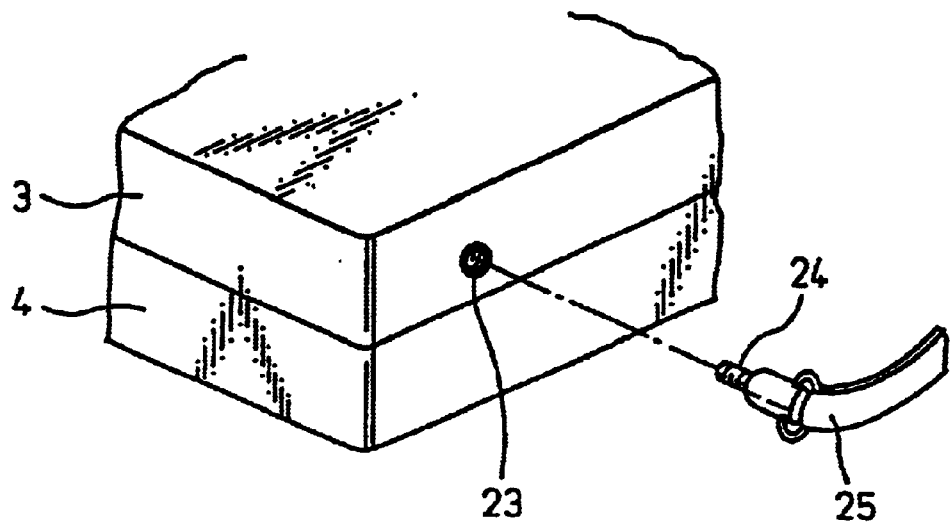
FIG. 15 is a view for explaining a second conventional structure.
Figure 16:
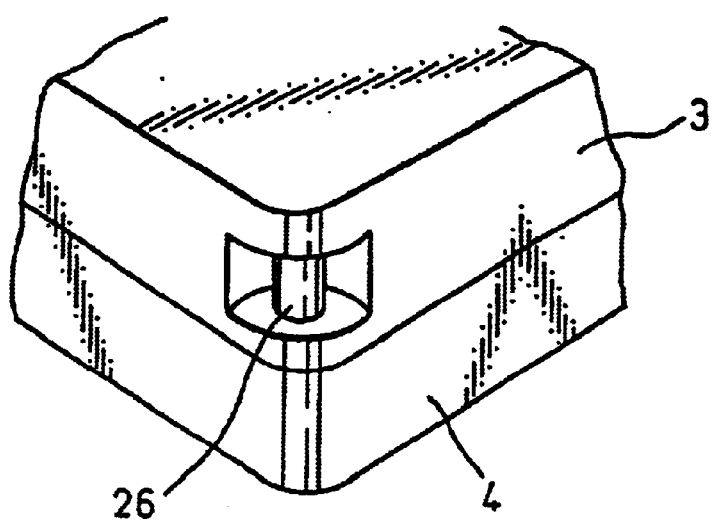
FIG. 16 is a view for explaining a third conventional structure.

When the upper cover 3 of FIG. 10 and the lower cover 4 of FIG. 11 are assembled together as shown in FIG. 12, the strap mounting structures 17 are formed at the four corners. Three strap mounting structures 17 include the bosses 8 and the strap mounting spaces 7, as explained heretofore. The remaining strap mounting structure 17 does not include the boss 8 and, instead, the space 7b is formed around the metal member 19 of the upper damper 5.

As explained above, according to the present invention, the attachment of the strap is established, utilizing the mounting boss for mounting the upper and lower covers. As a result, a special part for mounting the strap is not required, so that the apparatus cost and the apparatus size can be reduced correspondingly.

Also, the mounting boss is used for attaching the strap, and the screw passes through the boss, so the boss is substantially reinforced by the screw. Thus, there is an effect that a sufficient strength can be secured even when the strap is pulled.

Further, in the case where a strap mounting space is formed in the cover, an opening is formed in the surface of the cover fitted with the other cover eliminates the need of a slide mechanism in the die structure for the cover production and simplifies the equipment production process. In addition, the cover molding cost can be reduced.

What is claimed is:

1. A strap attaching structure for an apparatus, comprising:
   a housing having an upper cover and a lower cover, at least one of said covers having a protruding boss having an axial hole therethrough to abut against the other cover;
   the upper cover or the lower cover being molded integrally with said boss such that a space for mounting a strap is formed around the boss when the two covers are assembled together; and
   an upper damper and a lower damper, affording drop protection of the apparatus, a fastening element passing through the axial hole in each corresponding boss and securing together said upper and lower dampers and said upper cover and lower covers when assembled together, at a respective common corner thereof.

2. A strap attaching structure as set forth in claim 1, wherein:
   said upper cover has a boss and said lower cover has a boss ; and
   a tip end of the boss of said upper cover and a tip end of the boss of said lower cover abut against each other when the upper and lower covers are assembled together.

3. A strap attaching structure as set forth in claim 1, wherein said space comprises a slot for mounting said strap.

4. A strap attaching structure as set forth in claim 1, wherein a rib is formed around said boss, the rib guiding a forward end of the strap through the slit and preventing the forward end of the strap from being caught in the strap mounting space.

5. A strap attaching structure as set forth in claim 1, wherein:
   a space for mounting the strap is arranged at each of four corners of the housing fastening element coupling the upper cover and the lower cover to each other.

6. An electronic apparatus comprising a cover unit including an upper cover and a lower cover fitted in each other, wherein:
   said upper cover and said lower cover have respective upper and lower bosses integrally formed therein adjacent at least one common corner of the respective upper and lower covers, the bosses having corresponding axial holes extending therethrough which are axially aligned when the upper and lower covers are assembled with the bosses in abutting relationship, and through which aligned holes respective fastening elements extend and which fasten one cover to the other cover;

an upper damper and a lower damper, affording drop protection of the apparatus, fixed to the upper cover and the lower cover by corresponding fastening elements which pass through said aligned axial holes and secure together said upper damper, said lower damper, said upper cover and said lower cover when assembled together; and a space for mounting a strap extending around said aligned and abutting upper and lower bosses in a selected, common corner of the assembled, upper and lower covers.

7. An electronic apparatus comprising a housing including an upper cover and a lower cover, wherein:

said upper cover and said lower cover have respective upper and lower bosses integrally formed therein and having corresponding axial holes extending therethrough which are axially aligned when the upper and lower covers are assembled with the bosses in abutting relationship;

an upper damper and a lower damper, affording drop protection of the apparatus, fixed to the upper cover and the lower cover by corresponding fastening elements which pass through said aligned axial holes and secure together said upper damper, said lower damper, said upper cover and said lower cover when assembled together said two covers to each other;

a space for mounting a strap is formed around at least one of said aligned and abutting upper and lower bosses in a corresponding, common corner of the assembled upper and lower covers, and a member for guiding said strap through the space is formed around said boss.

8. The electronic apparatus as recited in claim 1, wherein each fastening element is an elongated screw having a head recessed in a corresponding recessed hole in one of the upper and lower dampers and extending through the axially aligned hole of the upper and lower, aligned bosses, a threaded end thereof being received in a threaded portion of an aligned hole in the other of the respective, upper and lower dampers.

9. The electronic apparatus as recited in claim 1, wherein each of the upper and lower covers has at least one common corner having a concave, arcuate sidewall, surrounding an interior side surface of the corresponding boss and spaced therefrom so as to define the strap mounting space.

10. The electronic apparatus as recited in claim 1, wherein a pair of ribs of a common height with each boss and extending from separated positions on a side surface of the boss, displaced at an angle relatively to each other and defining a sidewall of the space for mounting the strap.

11. The electronic apparatus as recited in claim 6, wherein each fastening element is an elongated screw having a head recessed in a corresponding recessed hole in one of the upper and lower dampers and extending through the axially aligned hole of the upper and lower, aligned bosses, a threaded end thereof being received in a threaded portion of an aligned hole in the other of the respective, upper and lower dampers.

12. The electronic apparatus as recited in claim 6, wherein each of the upper and lower covers has at least one common corner having a concave, arcuate sidewall, surrounding an interior side surface of the corresponding boss and spaced therefrom so as to define the strap mounting space.

13. The electronic apparatus as recited in claim 6, wherein a pair of ribs of a common height with each boss and extending from separated ed p positions on a side surface e of th e boss, displaced at an angle relatively to each other and defining a sidewall of the space for mounting the strap.

14. The electronic apparatus as recited in claim 7, wherein each fastening element is an elongated screw having a head recessed in a corresponding recessed hole in one of the upper and lower dampers and extending through the axially aligned hole of the upper and lower, aligned bosses, a threaded end thereof being received in a threaded portion of an aligned hole in the other of the respective, upper and lower dampers.

15. The electronic apparatus as recited in claim 7, wherein each of the upper and lower covers has at least one common corner h having a concave, arcuate sidewall, surrounding an interior side surface of the corresponding boss and spaced therefrom so as to define the strap mounting space.

16. The electronic apparatus as recited in claim 7, wherein the guiding member comprises a pair of ribs of a common height with each boss and extending from separated positions on a side surface of the boss, displaced at an angle relatively to each other and defining a sidewall of the space for mounting the strap.

* * * * *

UNITED STATES PATENT AND TRADEMARK OFFICE
CERTIFICATE OF CORRECTION

PATENT NO. : 6,655,540 B2
DATED : December 2, 2003
INVENTOR(S) : Yuji Shimoda et al.

It is certified that error appears in the above-identified patent and that said Letters Patent is hereby corrected as shown below:

<u>Title page,</u>
Item [57], ABSTRACT,
Line 8, change "slits" to -- slit --.

<u>Column 6,</u>
Line 40, change "lower covers" to -- lower cover --.
Line 45, change "boss ;" to -- boss; --.

<u>Column 8,</u>
Line 26, change "separated ed p" to -- separated -- and change "surface e" to
-- surface --.
Line 27, change "th e" to -- the --.
Line 38, change "corner h" to -- corner --.

Signed and Sealed this

Eighth Day of June, 2004

JON W. DUDAS
*Acting Director of the United States Patent and Trademark Office*